(12) United States Patent
Moon et al.

(10) Patent No.: US 7,985,697 B2
(45) Date of Patent: Jul. 26, 2011

(54) WAFER LEVEL PACKAGE AND METHOD OF FABRICATING THE SAME

(75) Inventors: Jong Tae Moon, Daejeon (KR); Yong Sung Eom, Daejeon (KR); Min Ji Lee, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 301 days.

(21) Appl. No.: 12/208,512

(22) Filed: Sep. 11, 2008

(65) Prior Publication Data
US 2009/0261481 A1 Oct. 22, 2009

(30) Foreign Application Priority Data
Apr. 17, 2008 (KR) .................... 10-2008-0035488

(51) Int. Cl.
*H01L 21/31* (2006.01)
(52) U.S. Cl. ............... 438/778; 438/779; 257/E21.521
(58) Field of Classification Search .................. 257/778, 257/779; 438/113
See application file for complete search history.

(56) References Cited

U.S. PATENT DOCUMENTS

| | | | |
|---|---|---|---|
| 6,743,656 B2 | 6/2004 | Orcutt et al. | |
| 2004/0077154 A1* | 4/2004 | Nagarajan et al. | 438/455 |
| 2006/0152615 A1* | 7/2006 | Kwon et al. | 348/340 |

FOREIGN PATENT DOCUMENTS

| | | |
|---|---|---|
| JP | 2007-189032 | 7/2007 |
| KR | 10-2006-0081201 | 7/2006 |

OTHER PUBLICATIONS

"Characterization and Reliability Verification of Wafer-Level Hermetic Package with Nano-Liter Cavity for RF-MEMS Applications", Suk-Jin Ham et al., pp. 1127-1134, 2007 Electronic Components and Technology Conference.

* cited by examiner

*Primary Examiner* — Phat X Cao
*Assistant Examiner* — Nga Doan
(74) *Attorney, Agent, or Firm* — Rabin & Berdo, P.C.

(57) ABSTRACT

Provided are a wafer level package in which a communication line can be readily formed between an internal device and the outside of the package, and a method of fabricating the wafer level package. The wafer level package includes a first substrate having a cavity in which a first internal device is disposed, an Input/Output (I/O) pad formed on the first substrate and electrically connected with the first internal device, a second substrate disposed over the first substrate and from which a part corresponding to the I/O pad is removed, and a solder bonding the first and second substrates. According to the wafer level package and the method of fabricating the same, upper and lower substrates are sawed to different cutting widths, or a hole is formed in the upper substrate, such that a communication line of an internal device can be readily formed without a via process which penetrates a substrate. Therefore, in comparison with a conventional wafer level package fabricated using the via process, it is possible to simplify a fabrication process and reduce production cost.

5 Claims, 5 Drawing Sheets

WAFER LEVEL PACKAGE AND METHOD OF FABRICATING THE SAME

CROSS-REFERENCE TO RELATED APPLICATION

This application claims priority to and the benefit of Korean Patent Application No. 2008-35488, filed Apr. 17, 2008, the disclosure of which is incorporated herein by reference in its entirety.

BACKGROUND

1. Field of the Invention

The present invention relates to a wafer level package and a method of fabricating the same, and more particularly, to a wafer level package in which a communication line can be readily formed between an internal device and the outside of the package, and a method of fabricating the wafer level package.

2. Discussion of Related Art

In general, devices performing specific functions, such as a Radio Frequency (RF) filter, an RF switch, a Microelectromechanical Systems (MEMS) structure and an actuator, which are manufactured in a chip unit, are vulnerable to moisture, particles and high temperature, and thus require separate packaging. The packaging is performed by covering and sealing an upper surface of a device wafer on which a device performing a specific function is formed with a cap having a cavity for accommodating the device.

A wafer level package refers to a device fabricated by sealing and packaging a wafer on which a plurality of devices are formed with a packaging cap formed in a wafer unit before cutting the wafer into unit chips.

FIG. 1 illustrates the structure of a conventional wafer level package.

Referring to FIG. 1, solders 130 are formed between an upper substrate 110 and a lower substrate 120, and the upper and lower substrates 110 and 120 are aligned and bonded by applying heat and pressure in a vacuum or a specific gas, thereby fabricating the conventional wafer level package. Here, an internal device 140 performing a particular function like an MEMS structure is disposed in a cavity formed in the upper substrate 110, sealed by the solders 130, and thus can be protected from outside.

Meanwhile, the upper substrate 110 includes communication lines 150 for exchanging an electrical signal between the internal device 140 and the outside of the package, and the communication lines 150 are formed by a via process penetrating the upper substrate 110. More specifically, the communication lines 150 are formed using a via filling technique of forming a through-hole in a substrate and then filling the hole with a metal. To process the through-holes, silicon deep-Reactive Ion Etching (RIE), a sand blasting technique, a laser processing technique, etc., are used.

However, the via process used to form a communication line penetrating a substrate is costly, amounting to about 30 to 40% of the total fabrication cost, and complicates the process.

SUMMARY OF THE INVENTION

The present invention is directed to providing a wafer level package capable of reducing production cost required for forming a communication line of an internal device of the wafer level package and the complexity of the fabrication process, and a method of fabricating the wafer level package.

One aspect of the present invention provides a wafer level package, including: a first substrate having a cavity in which a first internal device is disposed; an Input/Output (I/O) pad formed on the first substrate and electrically connected with the first internal device; a second substrate disposed over the first substrate and from which a part corresponding to the I/O pad is removed; and a solder bonding the first and second substrates.

Another aspect of the present invention provides a method of fabricating a wafer level package, including: forming an Input/Output (I/O) pad electrically connected with an internal device on a first substrate having a cavity in which the internal device is disposed; providing a solder on the first substrate and a second substrate disposed over the first substrate; aligning the first and second substrates; bonding the first and second substrates using the solder; cutting a device separation region of the second substrate using a first sawing blade; and cutting a device separation region of the first substrate to a width smaller than the cutting width of the device separation region of the second substrate using a second sawing blade.

Yet another aspect of the present invention provides a method of fabricating a wafer level package, including: forming an Input/Output (I/O) pad electrically connected with an internal device on a first substrate having a cavity in which the internal device is disposed; forming a hole at a part corresponding to the I/O pad in a second substrate disposed over the first substrate; forming a solder on the first and second substrates; aligning the first and second substrates; bonding the first and second substrates using the solder; and cutting device separation regions of the first and second substrates using a sawing blade.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Figure 1:
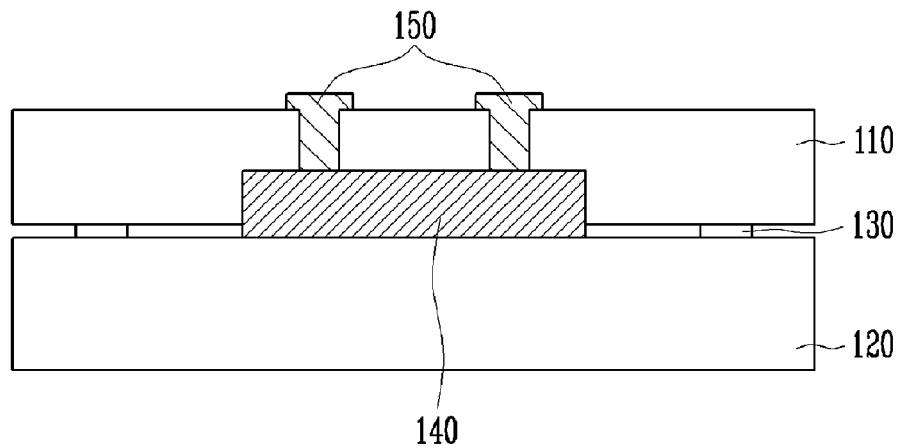
FIG. 1 illustrates the structure of a conventional wafer level package.

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention. Throughout the drawings and the following descriptions of exemplary embodiments, like numerals denote like elements. In the drawings, the sizes and thicknesses of layers and regions may be exaggerated for clarity.

FIGS. 2A to 2E illustrate a process of fabricating a wafer level package according to a first exemplary embodiment of the present invention.

Figure 2A:
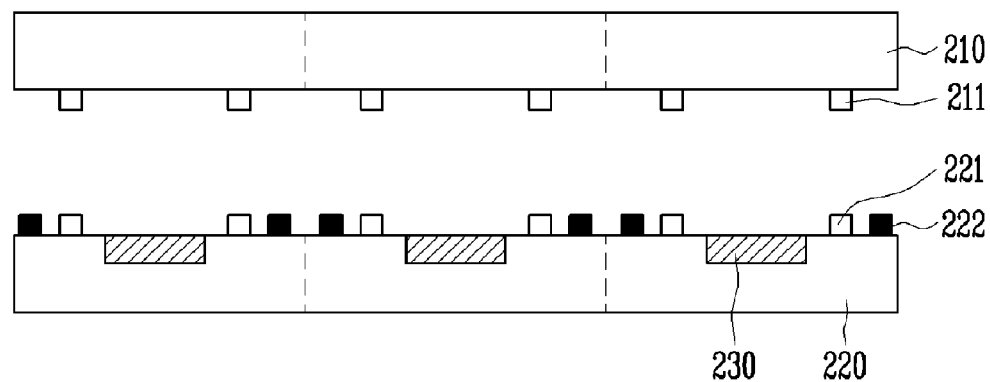
FIGS. 2A to 2E illustrate a process of fabricating a wafer level package according to a first exemplary embodiment of the present invention.

Referring to FIG. 2A, a lower substrate 220 includes cavities in which Microelectromechanical Systems (MEMS) structures 230 are disposed, and Input/Output (I/O) pads 222 electrically connected with the MEMS structures 230 are formed on the lower substrate. The I/O pads 222 may be made of a conductive material such as Au, Ag, Cu or Ni, and electrically connected with the MEMS structures 230 through patterns disposed on the lower substrate 220. In addition, to be exposed to outside by a sawing process, the I/O pads 222 are disposed adjacent to device separation regions for dividing the lower substrate 220 into unit devices.

The upper and lower substrates 210 and 220 may be wafers made of silicon, glass or so on. In the cavities of the lower substrate 220, devices such as Radio Frequency (RF) switches may be formed instead of the MEMS structures 230.

Solders 211 and 221 bonding the substrates are formed on the upper and lower substrates 210 and 220. As the solders 211 and 221, Au/Sn solders not using flux, and Sn, Cu, Pb—Sn, Sn—Ag, Sn—Ag—Cu, etc., solders using flux may be formed by plating. In some cases, Au stud bumps and Ag paste may be screen-printed and used as a bonding material.

Figure 2B:
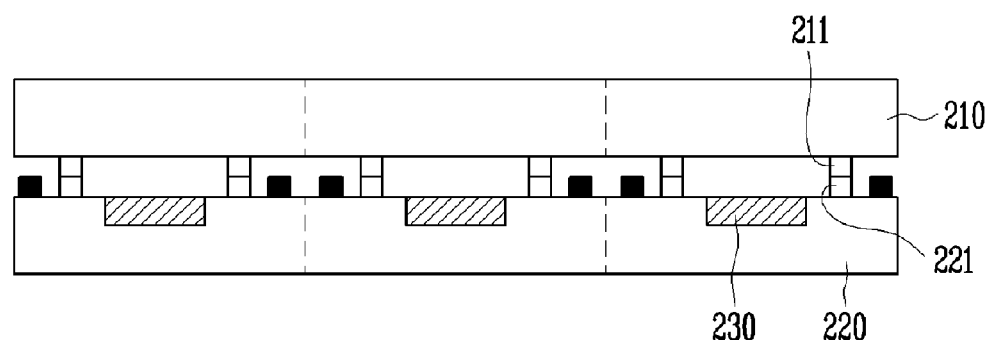

Referring to FIG. 2B, the upper and lower substrates 210 and 220 are aligned and bonded using the solders 211 and 221 formed on the respective substrates 210 and 220. Here, in order to protect the MEMS structures 230, the solders 211 and 221 used as a bonding material also function to isolate the MEMS structures 230 disposed in the cavities of the lower substrate 220 from the outside of chips.

Figure 2C:
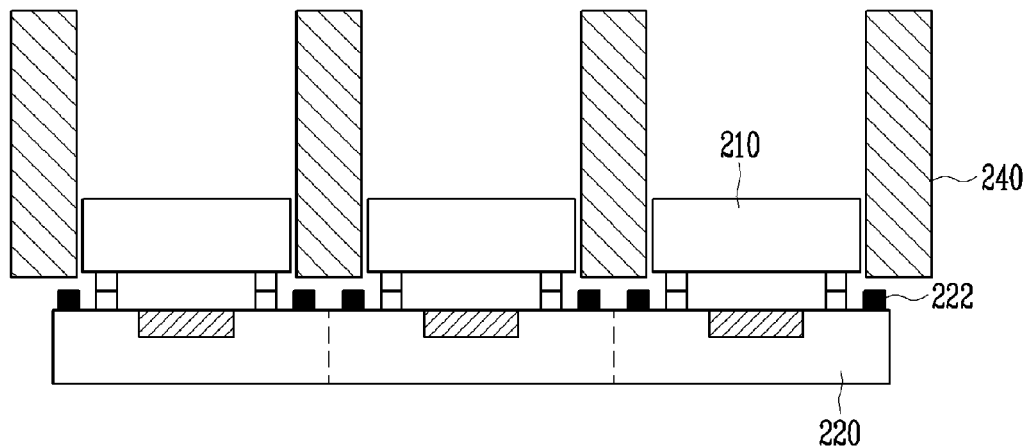

Referring to FIG. 2C, first sawing of device separation regions of the upper substrate 210 is performed using a first sawing blade 240. All the wafer sawing processes including the first sawing according to an exemplary embodiment of the present invention may be performed by moving a circular rotating blade that rotates at high speed in a straight line and cutting a wafer. In addition, when the bonding material may be damaged by impact caused when the wafer is cut by the circular rotating blade that rotates at high speed, a substrate may be cut using a non-contact cutting technique such as laser cutting or Infrared (IR) cutting.

Here, the cutting width of the first sawing must be large enough such that the I/O pads 222 on the lower substrate 220 can be exposed to outside through the cut parts. The device separation region of the upper substrate 210 may be cut by the width of 150 μm or more (preferably, 150 μm to 500 μm). Alternatively, the upper substrate 210 may be sawed several times using a thin rotating blade instead of a thick rotating blade to produce a wide cutting width.

For example, to expose 100 μm$^2$ quadrangle I/O pads formed on a lower wafer to outside, sawing may be performed once using a rotating blade having a width of 300 μm or several times (two or more times) using a thin rotating blade.

Figure 2D:
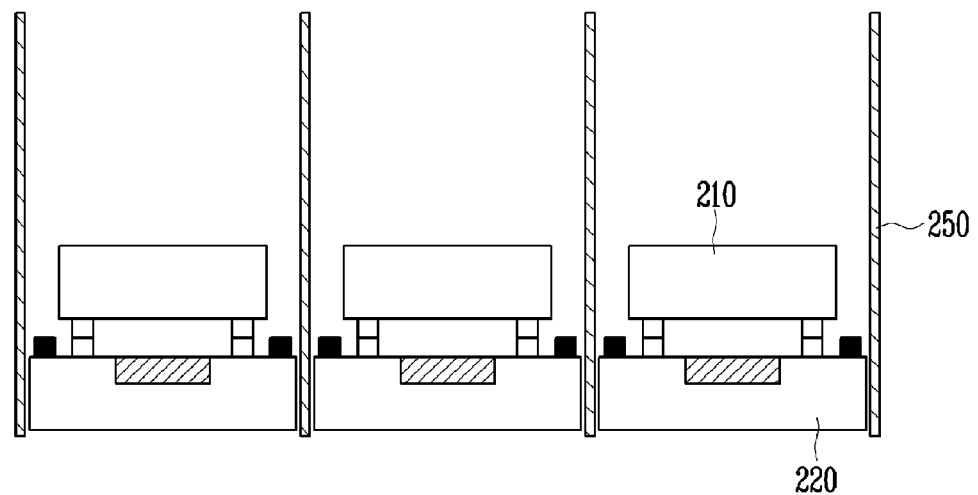

Referring to FIG. 2D, second sawing of the device separation regions of the lower substrate 220 is performed using a second sawing blade 250. Since the upper substrate 210 has already been divided by the first sawing, individual devices packaged by the upper and lower substrates 210 and 220 are completely separated by the second sawing. Here, the cutting width of the device separation region of the lower substrate 220 is smaller than the cutting width of the device separation regions of the upper substrate 210. The second sawing blade 250 may have a smaller thickness than the first sawing blade 240.

Figure 2E:
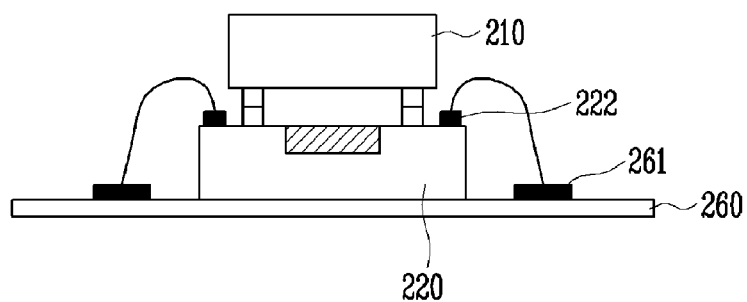

Referring to FIG. 2E, the wafer level package according to the first exemplary embodiment of the present invention comprises the lower substrate 220 on which the I/O pads 222 are formed, and the upper substrate 210 having a smaller width than the lower substrate 220. The I/O pads 222 disposed adjacent to the interfaces between devices on the lower substrate 220 are exposed to the outside of the device through the cut parts of the upper substrate 210.

Therefore, when a wafer level package device is mounted on a Printed Circuit Board (PCB) 260, the I/O pads 222 of an internal device may be readily connected with I/O terminals 261 of the PCB 260 using a general bonding method for connecting circuit terminals. The I/O pads 222 and the I/O terminals 261 may be connected by wire bonding, stud bumps, deposition bumps or wedge bonding. For example, the I/O pads 222 and the I/O terminals 261 may be connected by wire bonding using Au wires having a diameter of 1 mm or less.

FIGS. 3A to 3D illustrate a process of fabricating a wafer level package according to a second exemplary embodiment of the present invention.

Figure 3A:
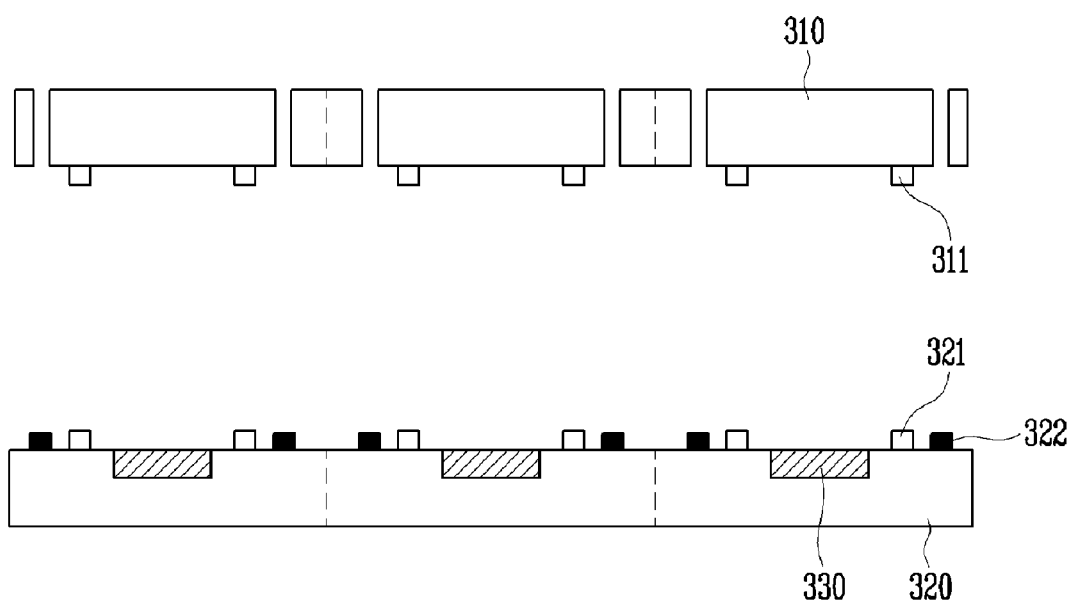
FIGS. 3A to 3D illustrate a process of fabricating a wafer level package according to a second exemplary embodiment of the present invention.

Referring to FIG. 3A, a lower substrate 320 includes cavities in which MEMS structures 330 are disposed, and solders 311 and 321 are formed on an upper substrate 310 and the lower substrate 320. Here, parts of the upper substrate 310 corresponding to I/O pads 322 disposed on the lower substrate 320 are etched to form holes in the upper substrate 310. The holes of the upper substrate 310 may be formed by wet etching or dry etching.

Figure 3B:
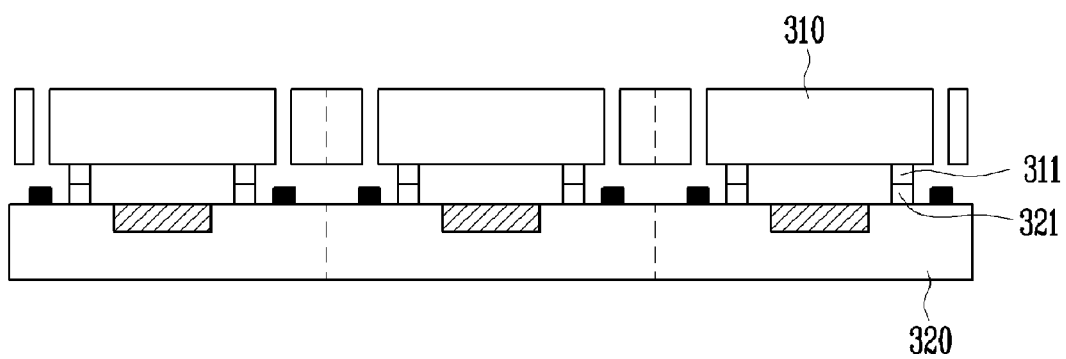

Referring to FIG. 3B, the upper and lower substrates 310 and 320 are aligned and bonded using the solders 311 and 321 formed on the respective substrates 310 and 320.

Figure 3C:
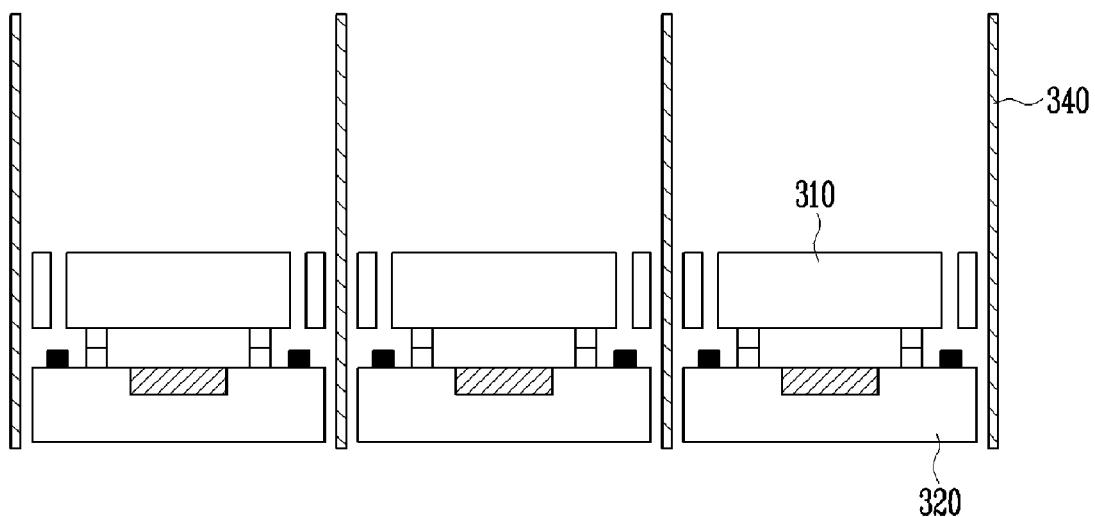

Referring to FIG. 3C, device separation regions of the upper and lower substrates 310 and 320 are cut using a sawing blade 340, and thus individual devices are separated.

Figure 3D:
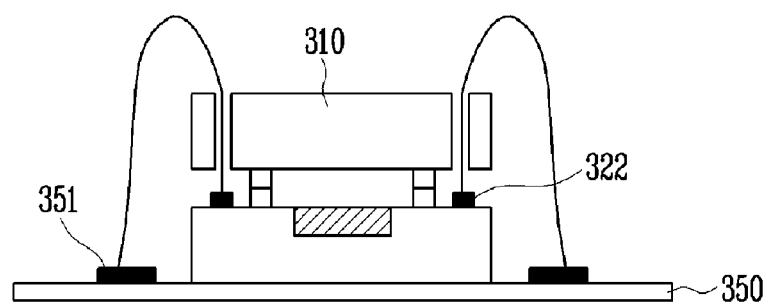

Referring to FIG. 3D, when a wafer level package device is mounted on a PCB 350, the I/O pads 322 of an internal device are connected with I/O terminals 351 of the PCB 350 through the holes formed in the upper substrate 310. The I/O pads 322 and the I/O terminals 351 may be connected by wire bonding, stud bumps, deposition bumps or wedge bonding.

As described above, upper and lower substrates are sawed to different cutting widths, or holes are formed in the upper substrate, such that communication lines can be readily formed between a device in a wafer level package and the outside of the device without a via process.

In addition, after the first sawing of the upper substrate or forming of holes in the upper substrate, a wafer-scale probe comes into contact with the exposed I/O pads, thereby measuring characteristics of respective internal devices. Thus, the conventional device test process, in which characteristic evaluation is individually performed after final sawing for dividing a wafer into individual devices, can be performed at a time.

Figure 4A:
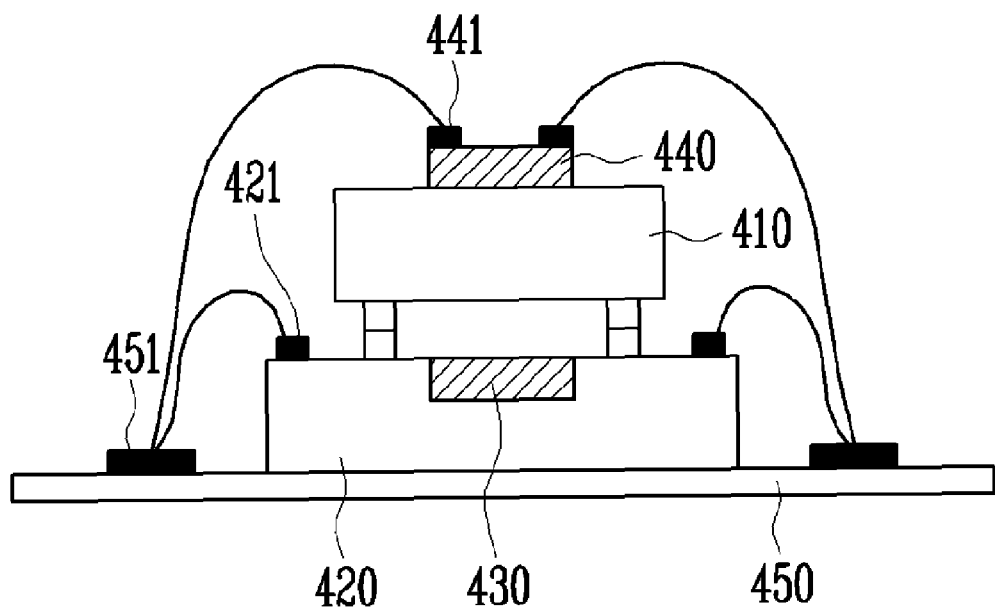
FIGS. 4A and 4B illustrate stacked structures of wafer level packages fabricated according to an exemplary embodiment of the present invention.
Figure 4B:
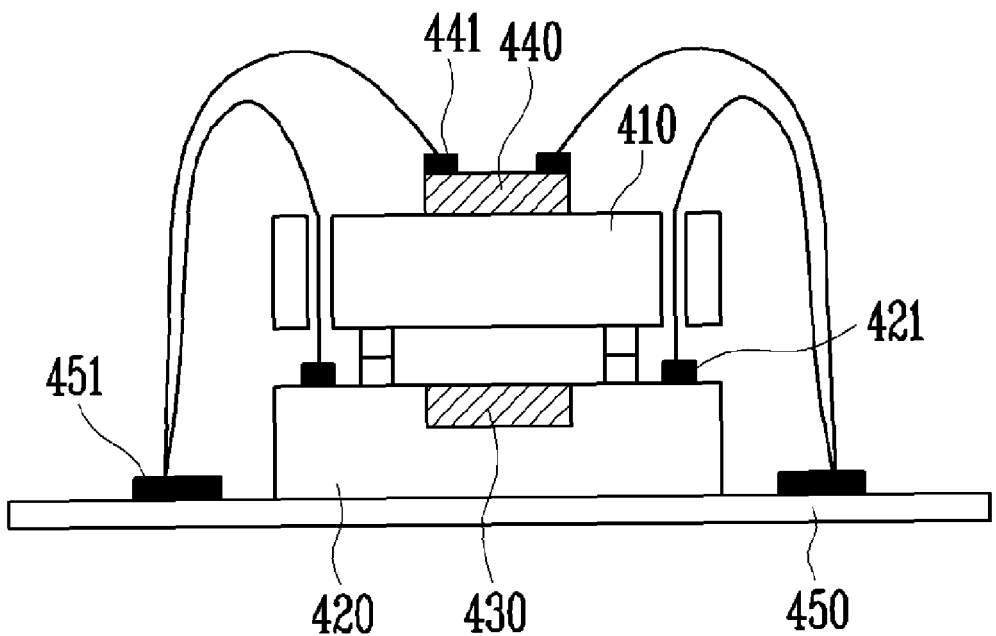

FIGS. 4A and 4B illustrate stacked structures of wafer level packages fabricated according to an exemplary embodiment of the present invention.

Referring to FIGS. 4A and 4B, a second internal device 440 is stacked on an upper substrate 410 of a wafer level package. The second internal device 440 may be the same type as a first internal device 430 disposed on a lower substrate 420.

Before sawing for dividing a wafer into individual devices, silver paste may be applied to a specific metal region on the upper substrate 410, and the second internal device 440 may be die-bonded to the metal region using a pick and place technique.

When the wafer level package in which the second internal device 440 is stacked on the upper substrate 410 is mounted on a PCB 450, I/O pads 441 of the second internal device 440 and I/O pads 421 of the first internal device 430 which are exposed by sawing or holes are connected with I/O terminals 451 of the PCB 450 by wire bonding.

By employing such stacked structures, it is possible to reduce unit mounting area and post processing time required for completing a module.

According to the present invention, upper and lower substrates are sawed to different cutting widths, or holes are formed in a substrate, such that I/O pads of an internal device of a package can be exposed to the outside of the package. Thus, it is possible to readily form communication lines of the internal device of the package without a via process which penetrates a substrate. Consequently, in comparison with a conventional wafer level package fabricated using the via process, a fabrication process can be simplified and production cost can be reduced.

In addition, after first sawing of the upper substrate or forming of the holes in the upper substrate, a wafer-scale probe comes into contact with the exposed I/O pad, thereby measuring characteristics of individual devices. Thus, the conventional device test process of evaluating characteristics individually after final sawing for dividing a wafer into individual devices can be performed all at one time.

Furthermore, the present invention provides a stacked structure using a wafer level package, and thus it is possible to reduce unit mounting area and post processing time required for completing a module.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of fabricating a wafer level package, comprising:
   forming a first Input/Output (I/O) pad electrically connected with a first internal device on a first substrate having a cavity in which the first internal device is disposed;
   forming a hole at a part corresponding to the first I/O pad in a second substrate disposed over the first substrate;
   forming a solder on the first and second substrates;
   aligning the first and second substrates;
   bonding the first and second substrates using the solder;
   forming a second internal device on an upper region of the second substrate corresponding to a place of the first internal device;
   forming a second I/O pad on the second internal device;
   cutting device separation regions of the first and second substrates using a sawing blade and forming a plurality of individual wafer level package devices to be separated from each other;
   mounting the individual wafer level package device on a Printed Circuit Board (PCB) having an I/O terminal; and
   connecting the first I/O pad and the second I/O pad with the I/O terminal by wire bonding.

2. The method of claim 1, further comprising:
   testing characteristics of the first internal device using the first I/O pad exposed through the hole formed in the second substrate.

3. The method of claim 1, wherein, in the forming the hole at the part corresponding to the first I/O pad in the second substrate, the hole in the second substrate is formed using wet etching or dry etching.

4. The method of claim 1, wherein forming the second internal device on an upper region of the second substrate comprises:
   applying a silver paste on the upper region of the second substrate; and
   die-bonding the second internal device to a metal region of the upper region of the second substrate using a pick and place technique.

5. The method of claim 1, wherein the first I/O pad is connected with the I/O terminal by a wire which passes through the hole formed in the second substrate.

* * * * *